(12) United States Patent
Fuchikami et al.

(10) Patent No.: US 11,391,472 B2
(45) Date of Patent: Jul. 19, 2022

(54) HEAT EXCHANGE UNIT

(71) Applicant: DAIKIN INDUSTRIES, LTD., Osaka (JP)

(72) Inventors: Hiroshi Fuchikami, Osaka (JP); Makoto Takayanagi, Osaka (JP); Taichi Koshiji, Osaka (JP); Takahiro Matsui, Osaka (JP); Hirotaka Doi, Osaka (JP); Yoshitsugu Koyama, Osaka (JP); Yukio Akita, Osaka (JP)

(73) Assignee: Daikin Industries, Ltd., Osaka (JP)

( * ) Notice: Subject to any disclaimer, the term of this patent is extended or adjusted under 35 U.S.C. 154(b) by 80 days.

(21) Appl. No.: 17/119,805

(22) Filed: Dec. 11, 2020

(65) Prior Publication Data
US 2021/0095871 A1 Apr. 1, 2021

Related U.S. Application Data

(63) Continuation of application No. PCT/JP2019/023617, filed on Jun. 14, 2019.

(30) Foreign Application Priority Data

Jun. 15, 2018 (JP) .............................. JP2018-114514

(51) Int. Cl.
*F24F 1/10* (2011.01)
*F28F 21/08* (2006.01)
*H03H 7/01* (2006.01)

(52) U.S. Cl.
CPC ............. *F24F 1/10* (2013.01); *F28F 21/08* (2013.01); *F28F 2265/24* (2013.01); *H03H 7/0115* (2013.01)

(58) Field of Classification Search
CPC ........ F24F 1/10; F24F 1/12; F24F 1/16; F24F 1/18; F24F 1/22; F24F 1/26; F24F 1/30;
(Continued)

(56) References Cited

U.S. PATENT DOCUMENTS

| 4,748,828 A * | 6/1988 | Chang ..................... F25D 21/14 62/272 |
| 2005/0034471 A1* | 2/2005 | Shin ......................... F24F 1/36 62/288 |

(Continued)

FOREIGN PATENT DOCUMENTS

| CN | 104220815 A | 12/2014 |
| JP | 2013-231526 A | 11/2013 |

OTHER PUBLICATIONS

European Search Report of corresponding EP Application No. 19 82 0194.9 dated Jun. 9, 2021.
(Continued)

*Primary Examiner* — Jianying C Atkisson
*Assistant Examiner* — Jose O Class-Quinones
(74) *Attorney, Agent, or Firm* — Global IP Counselors, LLP

(57) ABSTRACT

A heat exchange unit includes a heat exchanger, a structure supporting the heat exchanger, an insulating member electrically insulating the heat exchanger from the structure, a compressor electrically connected to the heat exchanger and the structure, and a connection member attached to the heat exchanger. The connection member electrically connects the heat exchanger and the structure. The connection member is provided separately from a first conductive path that electrically connects the compressor and the heat exchanger, and a second conductive path that electrically connects the compressor and the structure.

10 Claims, 12 Drawing Sheets

(58) Field of Classification Search
CPC ........ F24F 1/38; F24F 1/40; F24F 1/50; F24F 2013/202; F24F 13/24; F24F 2013/245; F24F 2013/247; F24F 13/30; F24F 2130/40; F28F 2265/24; F28F 2265/28
See application file for complete search history.

(56) References Cited

U.S. PATENT DOCUMENTS

| | | | |
|---|---|---|---|
| 2005/0120732 A1* | 6/2005 | Matsuoka | F24F 1/26 62/298 |
| 2014/0124175 A1* | 5/2014 | Sao | F24F 1/24 165/121 |
| 2015/0060029 A1 | 3/2015 | Ono et al. | |
| 2017/0205084 A1* | 7/2017 | Eskew | F24F 1/50 |
| 2017/0205158 A1* | 7/2017 | Eskew | F28D 1/0471 |
| 2017/0370597 A1* | 12/2017 | Kaneda | F28D 1/053 |
| 2019/0120556 A1* | 4/2019 | Ooki | F24F 1/16 |
| 2019/0301753 A1* | 10/2019 | Taniguchi | F24F 1/26 |

OTHER PUBLICATIONS

International Search Report of corresponding PCT Application No. PCT/JP2019/023617 dated Aug. 13, 2019.
International Preliminary Report of corresponding PCT Application No. PCT/JP2019/023617 dated Dec. 24, 2020.

* cited by examiner

HEAT EXCHANGE UNIT

CROSS-REFERENCE TO RELATED APPLICATIONS

This is a continuation of International Application No. PCT/JP2019/023617 filed on Jun. 14, 2019, which claims priority to Japanese Patent Application No. 2018-114514 filed on Jun. 15, 2018. The entire disclosures of these applications are incorporated by reference herein.

BACKGROUND

Field of Invention

The present disclosure relates to a heat exchange unit.

Background Information

JP 2013-231526 A discloses an outdoor unit of an air conditioner. The outdoor unit includes a casing, a compressor, and a heat exchanger. The heat exchanger is supported by an insulating rubber member provided on a bottom plate of the casing.

SUMMARY

A first aspect of the present disclosure relates to a heat exchange unit including: a heat exchanger; a structure that supports the heat exchanger; an insulating member that electrically insulates the heat exchanger from the structure; a compressor electrically connected to the heat exchanger and the structure; and a connection member that is attached to the heat exchanger and electrically connects the heat exchanger and the structure, the connection member being provided separately from a first conductive path that electrically connects the compressor and the heat exchanger and a second conductive path that electrically connects the compressor and the structure.

DETAILED DESCRIPTION OF EMBODIMENT(S)

Figure 1:
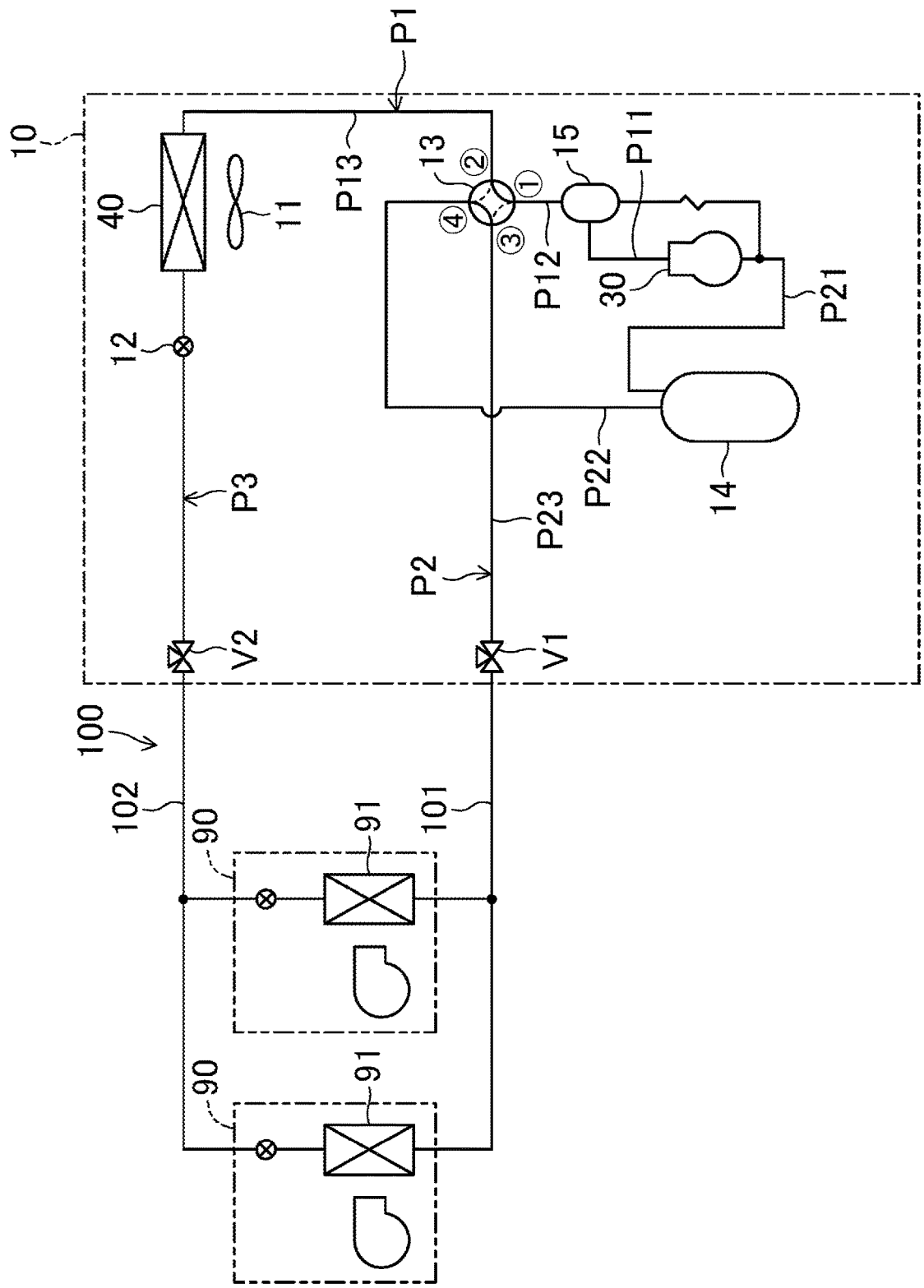
FIG. 1 is a piping system diagram illustrating a configuration of a heat exchange unit according to an embodiment.

An embodiment will be described in detail below with reference to the drawings.

Throughout the drawings, the same or corresponding parts are denoted with the same reference numerals and the description thereof will not be repeated.

Embodiment

FIG. 1 illustrates a configuration of a heat exchange unit (10) according to an embodiment. In this example, the heat exchange unit (10) is connected in parallel to a plurality of utilization-side units (90) through a gas-side connection pipe (101) and a liquid-side connection pipe (102), thereby forming a refrigerant circuit (100). A utilization-side heat exchanger (91) is provided in each of the utilization-side units (90). The utilization-side heat exchanger (91) exchanges heat between air and refrigerant. For example, the heat exchange unit (10) is an outdoor unit provided outdoors, and the utilization-side unit (90) is an indoor unit that cools and heats an indoor space.

The heat exchange unit (10) includes a gas shutoff valve (V1) to which the gas-side connection pipe (101) is connected, a liquid shutoff valve (V2) to which the liquid-side connection pipe (102) is connected, a compressor (30), a heat exchanger (40), a fan (11), an expansion valve (12), a four-way switching valve (13), an accumulator (14), and an oil separator (15). The heat exchange unit (10) also includes a first refrigerant pipe (P1) that connects the compressor (30) and the heat exchanger (40), a second refrigerant pipe (P2) that connects the compressor (30) and the gas shutoff valve (V1), and a third refrigerant pipe (P3) that connects the heat exchanger (40) and the liquid shutoff valve (V2). The first to third refrigerant pipes (P1 to P3) include a conductive metal (specifically, copper).

In this example, the first refrigerant pipe (P1) is provided with the oil separator (15) and the four-way switching valve (13). Specifically, the first refrigerant pipe (P1) includes a first pipe portion (P11), a second pipe portion (P12), and a third pipe portion (P13). The first pipe portion (P11) connects a discharge port of the compressor (30) and an inlet of the oil separator (15). The second pipe portion (P12) connects an outlet of the oil separator (15) and a first port of the four-way switching valve (13). The third pipe portion (P13) connects a second port of the four-way switching valve (13) and the heat exchanger (40). The second refrigerant pipe (P2) is provided with the accumulator (14) and the four-way switching valve (13). Specifically, the second refrigerant pipe (P2) includes a fourth pipe portion (P21), a fifth pipe portion (P22), and a sixth pipe portion (P23). The fourth pipe portion (P21) connects a suction port of the compressor (30) and an outlet of the accumulator (14). The fifth pipe portion (P22) connects an inlet of the accumulator (14) and a fourth port of the four-way switching valve (13). The sixth pipe portion (P23) connects a third port of the four-way switching valve (13) and the gas shutoff valve (V1). The third refrigerant pipe (P3) is provided with the expansion valve (12).

The compressor (30) compresses sucked refrigerant and discharges the refrigerant. The oil separator (15) separates refrigerant oil from the refrigerant discharged from the compressor (30). The four-way switching valve (13) can be switched between a first state (illustrated by the solid lines in FIG. 1) and a second state (illustrated by the broken lines in FIG. 1). In the first state, the first port and the second port communicate with each other while the third port and the fourth port communicate with each other. In the second state, the first port and the third port communicate with each other while the second port and the fourth port communicate with each other. The fan (11) conveys air to the heat exchanger (40). The heat exchanger (40) exchanges heat between the air conveyed by the fan (11) and the refrigerant. The expansion valve (12) is a mechanism that decompresses the refrigerant, and has an adjustable opening degree.

When the four-way switching valve (13) is set to the first state (illustrated by the solid lines in FIG. 1) and the compressor (30) and the fan (11) are driven, the heat exchanger (40) functions as a condenser while the utilization-side heat exchanger (91) functions as an evaporator. As a result, the heat of the refrigerant is released to the air in the heat exchanger (40), and the heat of the air is absorbed into the refrigerant in the utilization-side heat exchanger (91). When the four-way switching valve (13) is set to the second state (illustrated by the broken lines in FIG. 1) and the compressor (30) and the fan (11) are driven, on the other hand, the utilization-side heat exchanger (91) functions as a condenser while the heat exchanger (40) functions as an evaporator. As a result, the heat of the refrigerant is released to the air in the utilization-side heat exchanger (91), and the heat of the air is absorbed into the refrigerant in the heat exchanger (40).

Structure of Heat Exchange Unit

Figure 2:
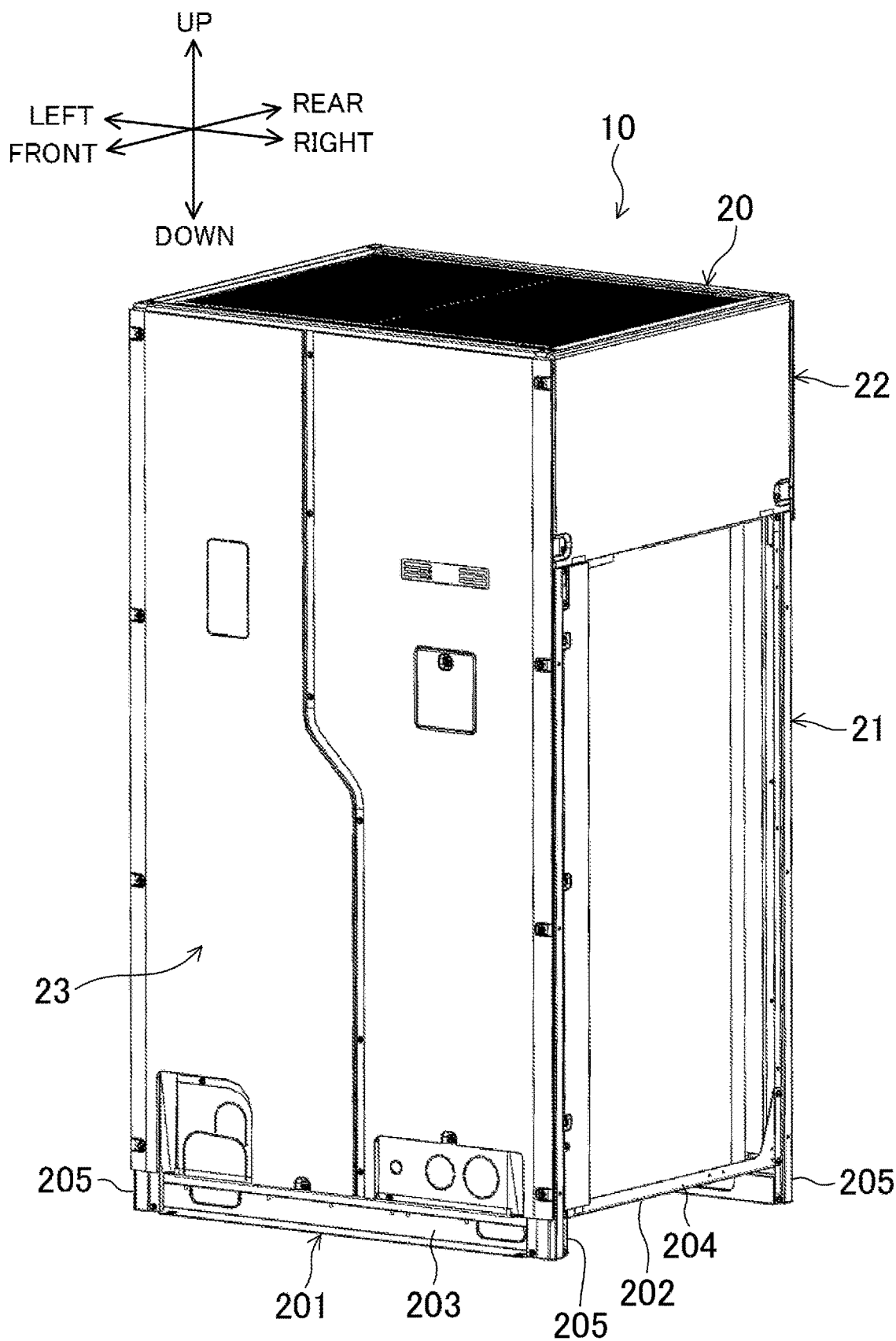
FIG. 2 is a perspective view illustrating an appearance of the heat exchange unit according to the embodiment.
Figure 3:
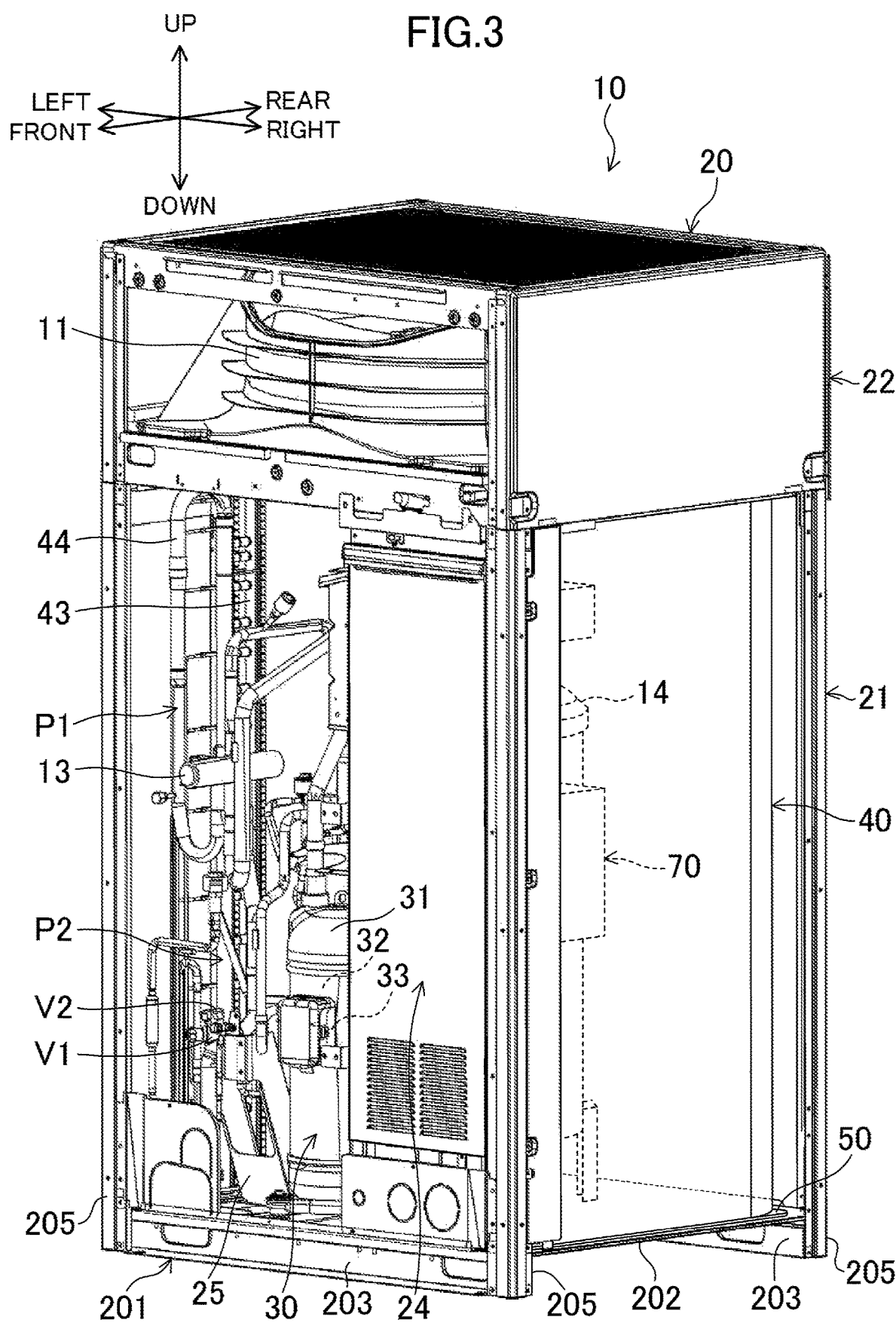
FIG. 3 is a perspective view illustrating a structure of the heat exchange unit from which a front panel has been removed.
Figure 4:
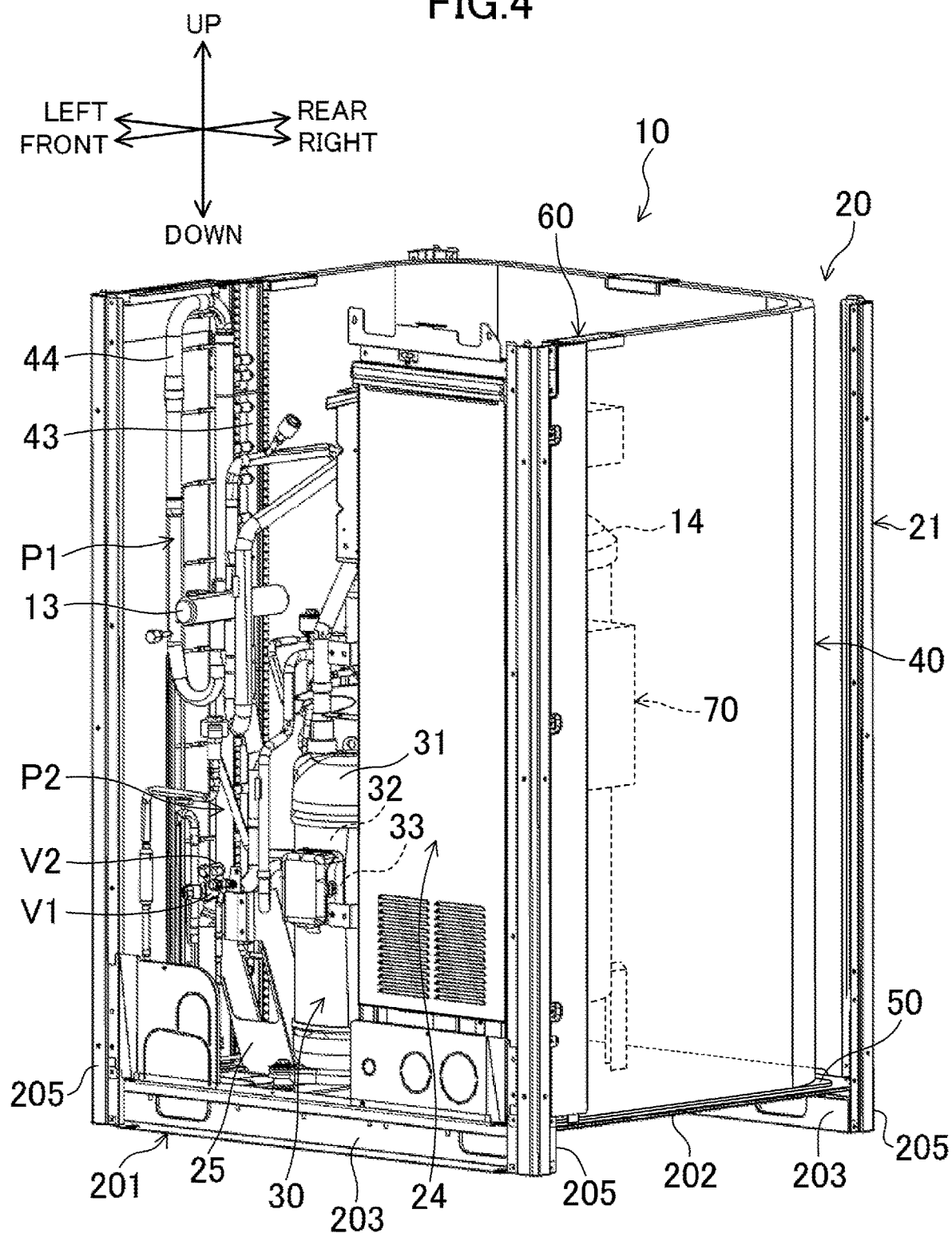
FIG. 4 is a perspective view illustrating the structure of the heat exchange unit from which the front panel and a second casing have been removed.
Figure 5:
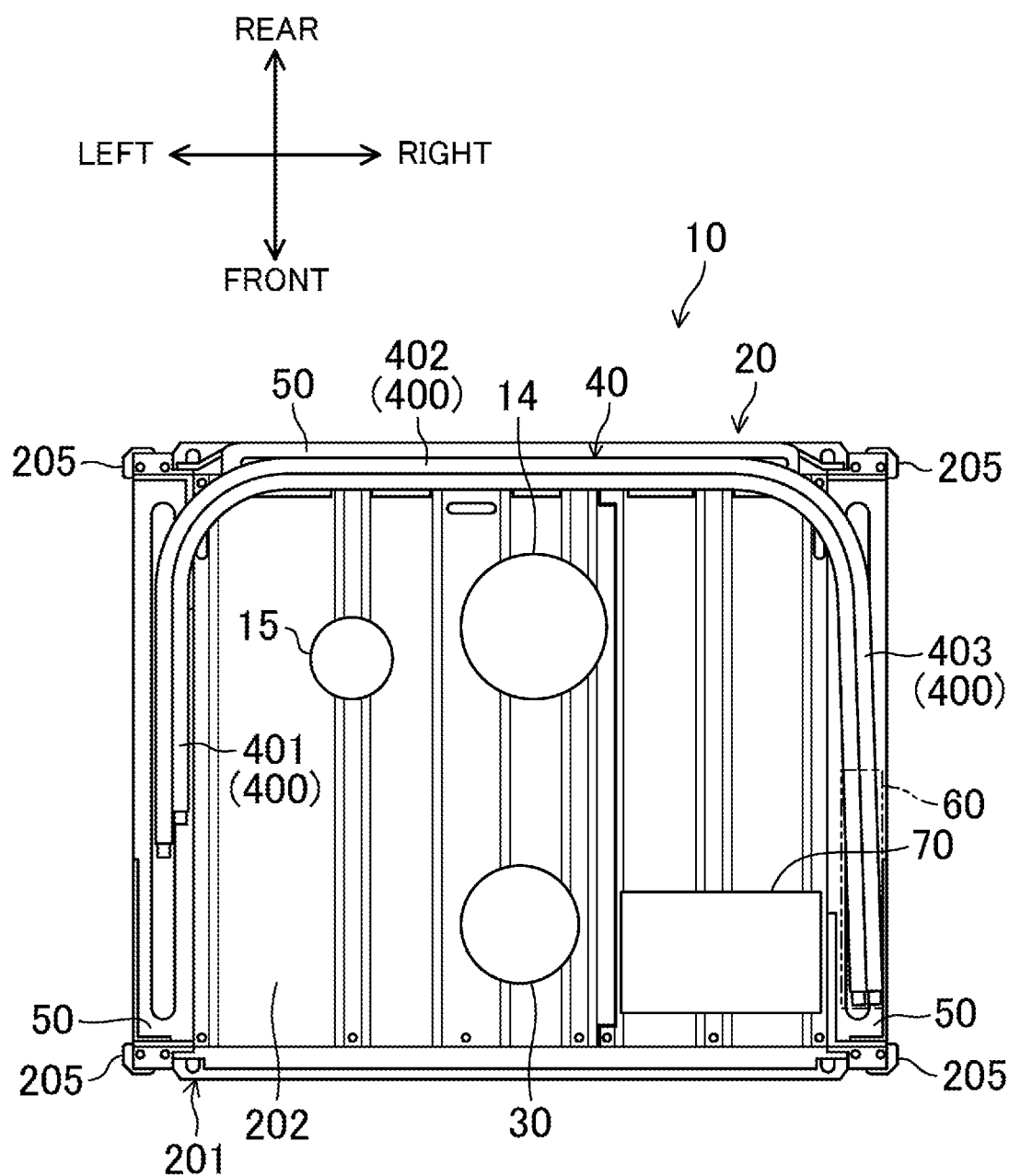
FIG. 5 is a top view illustrating an internal structure of the heat exchange unit from which the front panel and the second casing have been removed.

FIG. 2 illustrates an appearance of the heat exchange unit (10) according to the present embodiment, and FIGS. 3 to 5 illustrate an internal structure of the heat exchange unit (10) according to the present embodiment. In the following description, "front", "rear", "left", "right", "up", and "down" indicate the directions of the installed heat exchange unit (10) as viewed from the front.

The heat exchange unit (10) includes a structure (20), the compressor (30), the heat exchanger (40), one or a plurality of (in this example, three) insulating members (50), one or a plurality of (in this example, one) connection members (60), and an electric component box (70).

Structure

The structure (20) includes a first casing (21), a second casing (22), a front panel (23), and an electric component panel (24). In this example, the structure (20) includes a conductive metal (specifically, iron). The structure (20) is connected to the ground by a ground wire (not illustrated).

First Casing

The first casing (21) includes a base member (201) and four support members (205). The base member (201) is formed in a rectangular shape. The base member (201) includes a bottom plate (202), two foundation legs (203), and two side stays (204). Protrusions and recesses continuous in the left-right direction are formed on the bottom plate (202). The two foundation legs (203) are each formed in a plate shape extending in the left-right direction, and are fixed to a front edge portion and a rear edge portion of the bottom plate (202). The two side stays (204) are each formed in a plate shape extending in the front-rear direction, and are fixed to left and right side edge portions of the bottom plate (202). The four support members (205) are each formed in a plate shape extending in the vertical direction, and are provided at four corners of the base member (201). The first casing (21) houses the compressor (30), the heat exchanger (40), the expansion valve (12), the four-way switching valve (13), the accumulator (14), and the oil separator (15).

Second Casing

The second casing (22) is formed in the shape of a rectangular parallelepiped box, and is provided above the first casing (21). The second casing (22) houses the fan (11). The fan (11) is configured to blow air upward. When the fan (11) is rotated, air is sucked into the first casing (21) from the outside of the structure (20) through the heat exchanger (40), and the air sucked into the first casing (21) is blown upward from the second casing (22) through the fan (11).

Front Panel

The front panel (23) includes two vertically elongated plate members (front panels) that cover almost the entire area from the lower end of the first casing (21) to the upper end of the second casing (22). The front panel (23) is mounted across the front surface of the first casing (21) and the front surface of the second casing (22).

Electric Component Panel

The electric component panel (24) is formed in a plate shape extending in the vertical direction, and is provided in the direction of the front panel (23). The electric component panel (24) is provided with the electric component box (70).

Shutoff Valve Support Stand

The structure (20) is also provided with a shutoff valve support stand (25). The shutoff valve support stand (25) is fixed to the bottom plate (202) of the structure (20). The gas shutoff valve (V1) and the liquid shutoff valve (V2) are fixed to and supported by the shutoff valve support stand (25). In this example, the shutoff valve support stand (25) includes the same kind of metal (specifically, iron) as the metal forming the structure (20).

Compressor

The compressor (30) includes a compressor casing (31), a compression mechanism (32), and a motor (33). The compressor casing (31) is formed in a tubular shape with both ends closed, and houses the compression mechanism (32) and the motor (33). The compression mechanism (32) compresses the sucked refrigerant and discharges the refrigerant. The motor (33) drives the compression mechanism (32). The compressor casing (31) includes a conductive metal (for example, copper).

Heat Exchanger

Figure 6:
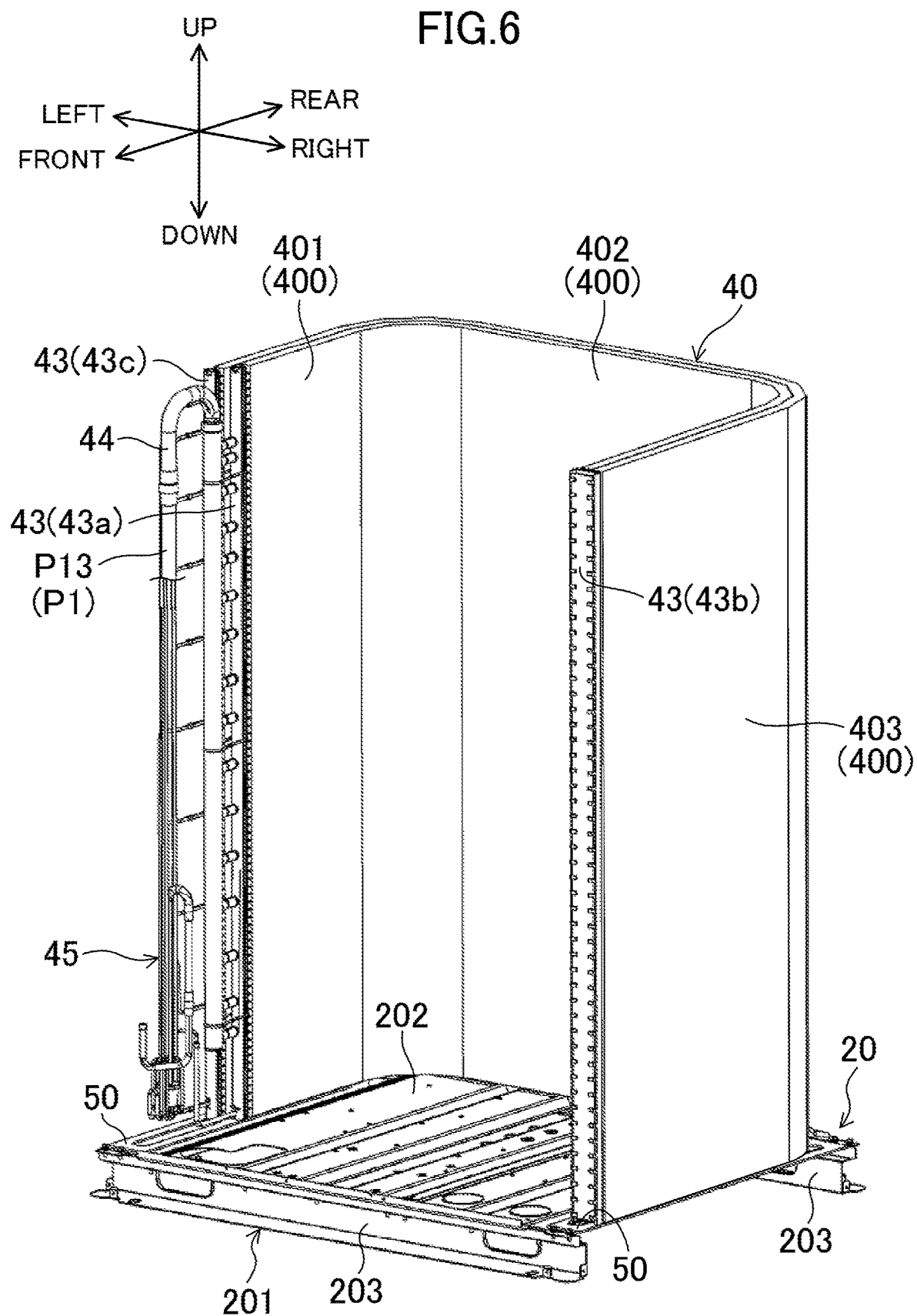
FIG. 6 is a perspective view illustrating a part of a structure, a heat exchanger, and an insulating member.
Figure 7:
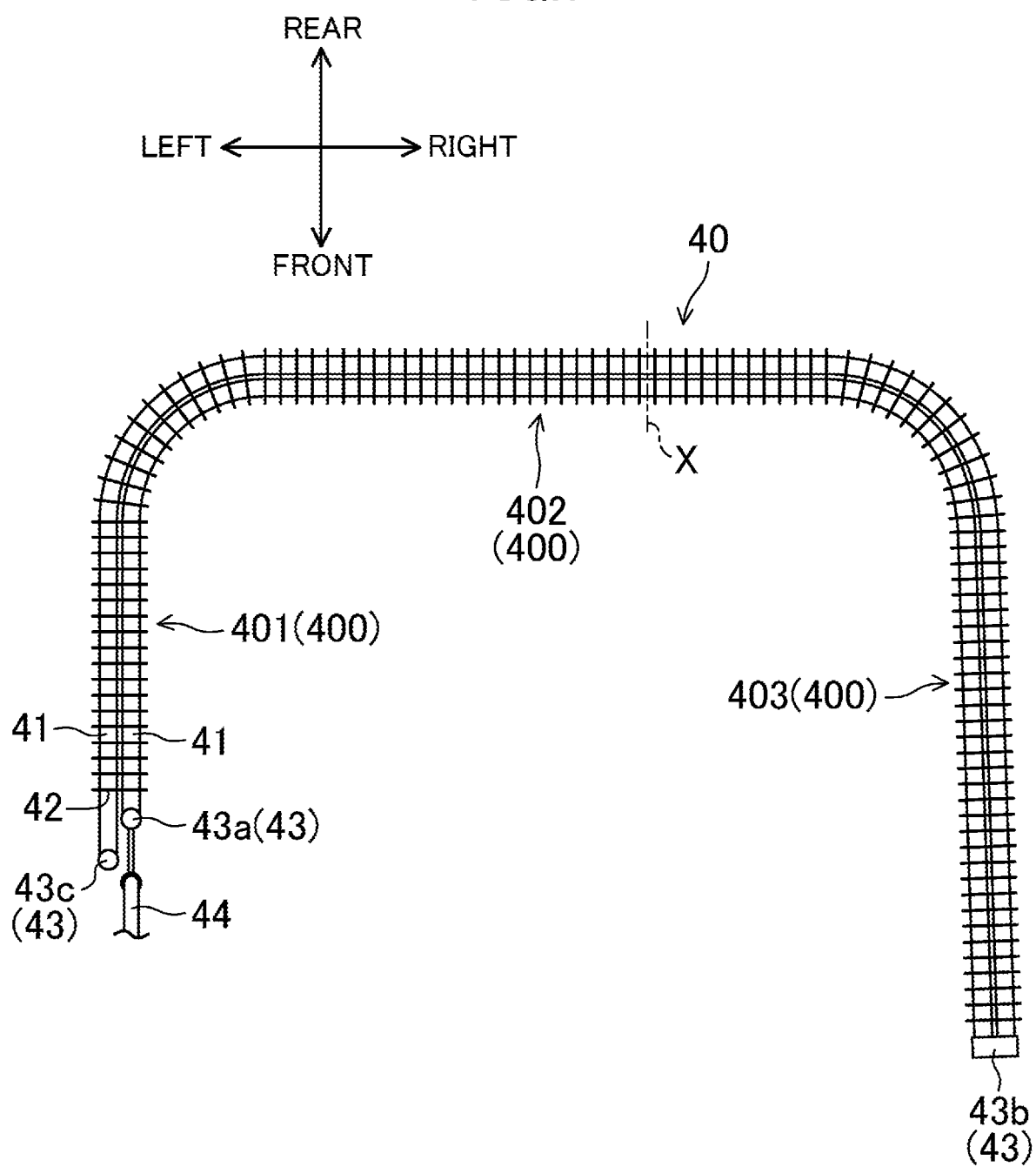
FIG. 7 is a top view illustrating a configuration of the heat exchanger.

As illustrated in FIGS. 6 and 7, the heat exchanger (40) extends in a first direction. In this example, the heat exchanger (40) is formed in a U shape in top view, extending from left front to left rear, from left rear to right rear, and from right rear to right front. That is, the first direction is a direction in which the heat exchanger (40) extends from left front to right front in the U shape. The first refrigerant pipe (P1) (third pipe portion (P13) in this example) is connected to one end (specifically, the left front end) of the heat exchanger (40) in the first direction.

Specifically, in this example, the heat exchanger (40) includes a plurality of heat transfer tubes (41), a plurality of fins (42), a plurality of header collecting tubes (43) (in this example, a first header collecting tube (43a), a second header collecting tube (43b), and a third header collecting tube (43c)), a connection tube (44), and a flow divider (45).

The plurality of heat transfer tubes (41) is disposed parallel to each other in the vertical direction while extending in the horizontal direction. The plurality of heat transfer tubes (41) extends along the first direction (direction of the U shape in this example). In this example, the heat exchanger (40) is a multiple-row heat exchanger (40) in which the heat transfer tubes (41) are arranged in two rows in plan view. The plurality of fins (42) is arranged at a predetermined pitch in the first direction and attached to the plurality of heat transfer tubes (41). The first header collecting tube (43a) and the third header collecting tube (43c) are each formed in a cylindrical shape and disposed at one end side in the extending direction of the heat transfer tubes (41). One end of each of the heat transfer tubes (41) is connected to the first header collecting tube (43a) or the third header collecting tube (43c). The second header collecting tube (43b) is formed in a tubular shape having a rectangular cross section, and disposed at the other end side in the extending direction of the heat transfer tubes (41). The other end of each of the heat transfer tubes (41) is connected to the second header collecting tube (43b). In this example, during the cooling operation, the refrigerant flowing through the heat transfer tube (41) from the first header collecting tube (43a) toward the second header collecting tube (43b) turns back at the second header collecting tube (43b). The refrigerant that has turned back at the second header collecting tube (43b) flows into a different heat transfer tube (41) from the one through which the refrigerant has flowed before turning back, and then flows from the second header collecting tube (43b) toward the third header collecting tube (43c).

The connection tube (44) is connected to the first header collecting tube (43a) disposed at the one end side in the extending direction of the heat transfer tubes (41). The first refrigerant pipe (P1) (third pipe portion (P13) in this example) is connected to the connection tube (44). That is, the heat exchanger (40) is configured such that the first refrigerant pipe (P1) is connected to the one end (one end of the heat exchanger (40)) in the extending direction of the heat transfer tubes (41), and the refrigerant flowing through the heat transfer tubes (41) turns back at the other end (the other end of the heat exchanger (40)) in the extending direction of the heat transfer tubes (41). The flow divider (45) is connected to the third header collecting tube (43c) disposed at the one end side in the extending direction of the heat transfer tubes (41). The third refrigerant pipe (P3) is connected to the flow divider (45).

In this example, the heat exchanger (40) includes a plurality of heat exchange sections (400) (in this example, a first heat exchange section (401), a second heat exchange section (402), and a third heat exchange section (403)). Each of the plurality of heat exchange sections (400) is formed in a plate shape, and arranged along the first direction (direction of the U shape in this example). Specifically, the first heat exchange section (401), the second heat exchange section (402), and the third heat exchange section (403) are arranged in that order from one end side to the other end side in the first direction. The first refrigerant pipe (P1) is connected to any one of the plurality of heat exchange sections (400) (in this example, the first heat exchange section (401) located at the one end side in the first direction).

In this example, the heat exchanger (40) includes a metal (specifically, aluminum) different from the metal forming the structure (20). Specifically, the plurality of heat transfer tubes (41), the plurality of fins (42), the plurality of header collecting tubes (43), and the connection tube (44) that constitute the heat exchanger (40) include aluminum.

Insulating Member

The insulating members (50) electrically insulate the heat exchanger (40) from the structure (20). In this example, the insulating members (50) are placed on the bottom plate (202) of the structure (20), and the heat exchanger (40) is placed on the insulating members (50). Specifically, as illustrated in FIG. 5, the three insulating members (50) are disposed between the three heat exchange sections (400) of the heat exchanger (40) and the bottom plate (202) of the structure (20).

In this example, the insulating members (50) have insulating properties and elasticity. For example, the insulating members (50) include insulating rubber.

Connection Member

The connection member (60) is attached to the heat exchanger (40). In this example, in the heat exchanger (40), the connection member (60) is attached to a position closer to the other end of the heat exchanger (40) in the first direction than to a connecting portion between the heat exchanger (40) and the first refrigerant pipe (P1). That is, in the heat exchanger (40), the connection member (60) is attached to a portion from the connecting portion between the heat exchanger (40) and the first refrigerant pipe (P1) to the other end of the heat exchanger (40) in the first direction (but not including the connecting portion between the heat exchanger (40) and the first refrigerant pipe (P1)).

Specifically, in the heat exchanger (40), the connection member (60) is attached to a portion from a center (X) (see FIG. 7) in the extending direction of the heat transfer tubes (41) to the other end (right front end in this example) in the extending direction of the heat transfer tubes (41). That is, the connection member (60) is attached to a portion from the center (X) between the one end of the heat exchanger (40) and the other end of the heat exchanger (40) in the extending direction of the heat transfer tubes (41) to the other end of the heat exchanger (40). The center (X) of the heat transfer tube (41) is at the center position of the length from the one end to the other end of the heat transfer tube (41). In other words, the connection member (60) is attached to, among the plurality of heat exchange sections (400), the heat exchange section (400) other than the heat exchange section (400) (first heat exchange section (401) in this example) to which the first refrigerant pipe (P1) is connected.

The connection member (60) is attached to an upper part of the heat exchanger (40). In this example, the connection member (60) is attached to the upper end of the heat exchanger (40) and disposed between the heat exchanger (40) and the second casing (22).

Figure 8:
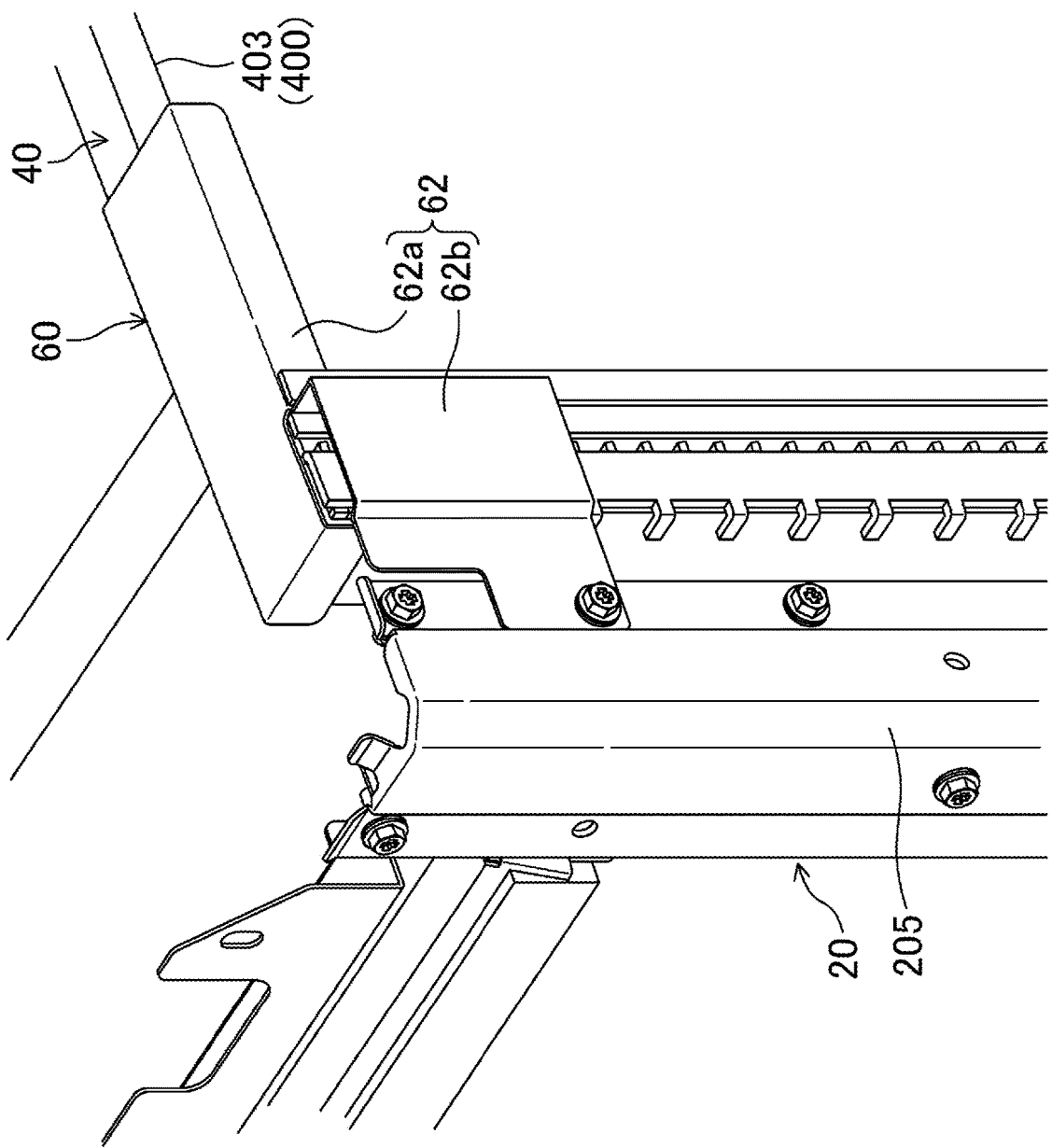
FIG. 8 is an enlarged perspective view illustrating a connection member attached to the heat exchanger and fixed to the structure.

In this example, as illustrated in FIGS. 4, 5, and 8, the connection member (60) is attached to the upper end at the other end of the heat exchanger (40) in the first direction. In other words, the connection member (60) is attached to the upper end of, among the plurality of heat exchange sections (400), the third heat exchange section (403) farthest in the first direction from the first heat exchange section (401) to which the first refrigerant pipe (P1) is connected.

In this example, as illustrated in FIG. 8, the connection member (60) is fixed to the structure (20). Specifically, the connection member (60) is fixed (fixed by a screw in this example) to the support member (205) of the structure (20).

Configuration of Connection Member

Figure 9:
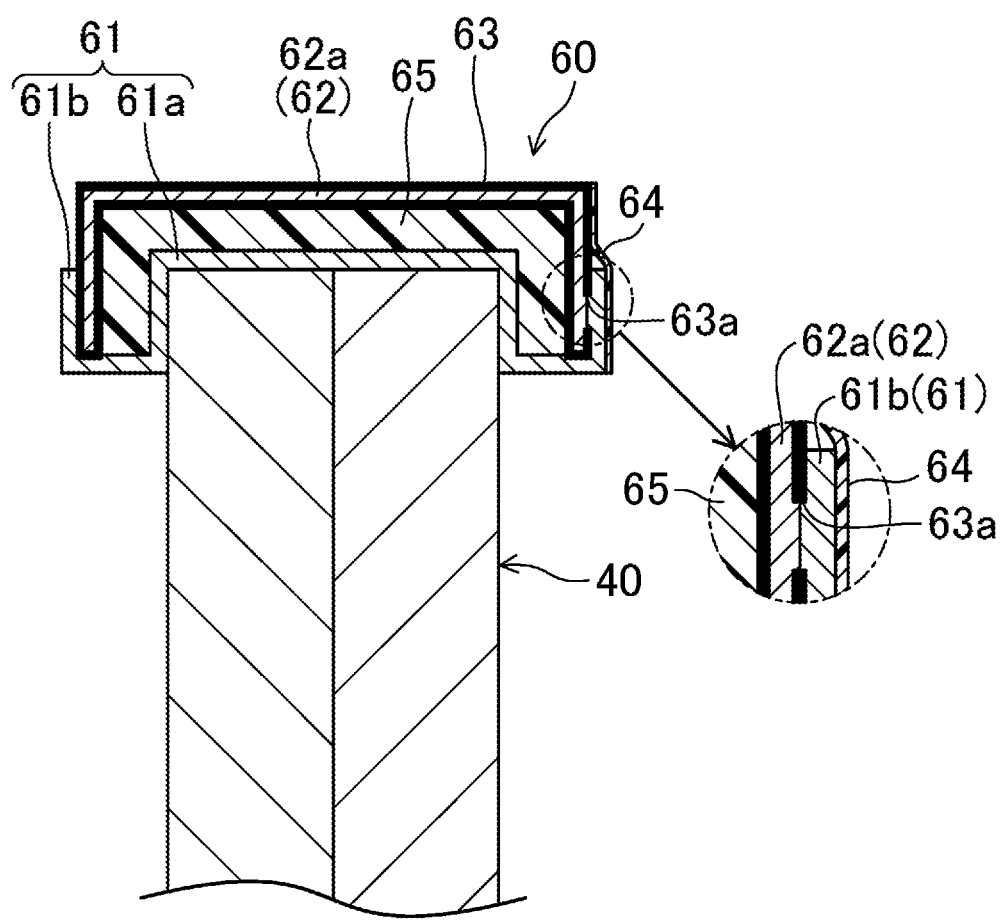
FIG. 9 is a cross-sectional view illustrating a configuration of the connection member.

As illustrated in FIGS. 8 and 9, the connection member (60) includes a first connection portion (61), a second connection portion (62), an insulating layer (63), a covering member (64), and a seal member (65).

First Connection Portion

The first connection portion (61) includes the same kind of metal (aluminum in this example) as the metal forming the heat exchanger (40), and is in contact with the heat exchanger (40). In this example, the first connection portion (61) includes a main body portion (61a) and a folded portion (61b). The main body portion (61a) of the first connection portion (61) is formed to have a U-shaped cross section that opens downward so as to fit to the upper end of the heat exchanger (40) from above. The folded portion (61b) of the first connection portion (61) is folded back upward from the lower end of the main body portion (61a) having the U-shaped cross section.

Second Connection Portion

The second connection portion (62) includes the same kind of metal (iron in this example) as the metal forming the structure (20), and is fixed to the structure (20). In this example, the second connection portion (62) includes a main body portion (62a) and an extension portion (62b). The main body portion (62a) of the second connection portion (62) is formed to have a U-shaped cross section that opens downward so as to fit to the main body portion (61a) of the first connection portion (61) from above with the seal member (65) (described below) interposed therebetween. The extension portion (62b) of the second connection portion (62) extends from the main body portion (62a) of the second connection portion (62) and is fixed to the support member (205) of the structure (20) (fixed by a screw in this example).

Insulating Layer

The insulating layer (63) electrically insulates the first connection portion (61) from the second connection portion (62). The insulating layer (63) is provided with a gap portion (63a) that allows a part of the first connection portion (61) and a part of the second connection portion (62) to contact each other. In this example, the insulating layer (63) includes insulating paint applied to the surface of the main body portion (62a) of the second connection portion (62). A part of the insulating paint applied to the surface of the main body portion (62a) of the second connection portion (62) is peeled off to form the gap portion (63a).

Covering Member

The covering member (64) covers the contact portion between the first connection portion (61) and the second connection portion (62) (that is, the gap portion (63a) of the insulating layer (63)). In this example, the covering member (64) includes a waterproof tape.

Seal Member

The seal member (65) is formed to have a U-shaped cross section that opens downward so as to fit to the main body portion (61a) of the first connection portion (61) from above, and provided between the main body portion (61a) of the first connection portion (61) and the main body portion (62a) of the second connection portion (62). The seal member (65) includes, for example, a rubber insulating material such as ethylene propylene diene rubber (EPDM).

Electric Component Box

The electric component box (70) houses electric components (e.g. a power converter (71) and a noise filter (72)) that constitute the power supply system of the heat exchange unit (10), and electronic components for controlling the components (e.g. the compressor (30), the fan (11), the expansion valve (12), and the four-way switching valve (13)) of the heat exchange unit (10).

Power Supply System

Figure 10:
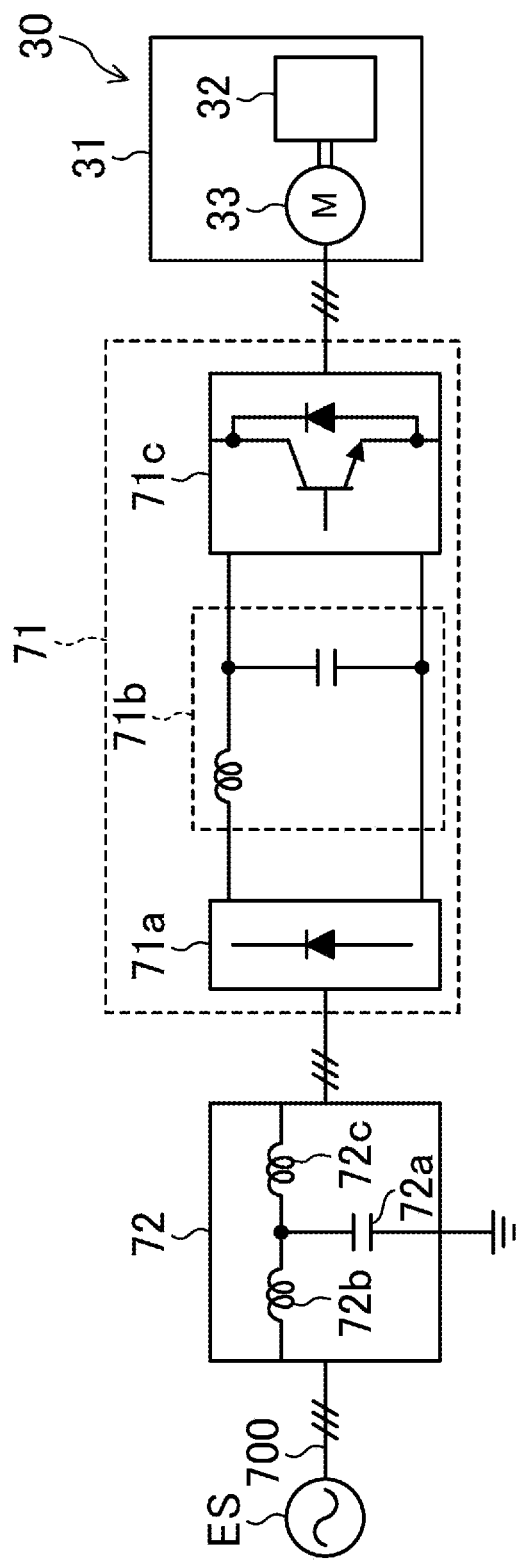
FIG. 10 is a block diagram illustrating a configuration of a power supply system.

FIG. 10 illustrates the configuration of the power supply system of the heat exchange unit (10). The power supply system is connected to a power source (ES) and the motor (33) of the compressor (30), and includes the power converter (71) and the noise filter (72).

Power Converter

The power converter (71) is configured to convert the power supplied from the power source (ES) into predetermined output power by a switching operation and supply the output power to the motor (33) of the compressor (30). The switching operation of the power converter (71) is controlled by, for example, pulse width modulation control. In this example, the power converter (71) includes a converter circuit (71a), a DC link portion (71b), and an inverter circuit (71c).

The converter circuit (71a) is configured to rectify the power (three-phase AC power in this example) supplied from the power source (ES). For example, the converter circuit (71a) includes a diode bridge circuit in which a plurality of rectifying diodes is connected in a bridged manner.

The DC link portion (71b) is configured to smooth the output of the converter circuit (71a) and output the smoothed output to the inverter circuit (71c). For example, the DC link portion (71b) includes a smoothing capacitor and a reactor.

The inverter circuit (71c) includes a plurality of switching elements, and is configured to convert the power (DC power) from the DC link portion (71b) to predetermined output power (three-phase AC power in this example) through switching operations of the plurality of switching elements. Specifically, in order to supply the three-phase AC power to the motor (33), the inverter circuit (71c) includes six switching elements connected in a bridged manner, and six freewheeling diodes respectively connected in anti-parallel to the six switching elements. To explain in detail, the inverter circuit (71c) includes three switching legs formed by connecting two switching elements in series with each other. The midpoint of the three switching legs (i.e., the connection point between the switching element on the upper arm side and the switching element on the lower arm side) is connected to three-phase windings (U-phase, V-phase, and W-phase windings) of the motor (33). The switching operation of the inverter circuit (71c) is controlled by, for example, pulse width modulation control.

Noise Filter

The noise filter (72) is provided on a power source line (700) that connects the power source (ES) and the power converter (71). The noise filter (72) is configured to reduce noise. Specifically, the noise filter (72) includes a Y capacitor (72a), a power source-side common mode choke coil (72b), and a load-side common mode choke coil (72c).

One end of the Y capacitor (72a) is connected to the power source line (700), while the other end of the Y capacitor (72a) is connected to the ground. In this example, the Y capacitor (72a) includes three capacitors respectively connected between three power source lines and the ground.

The power source-side common mode choke coil (72b) is provided, on the power source line (700), between the power source (ES) and one end of the Y capacitor (72a) (that is, the connection point between the power source line (700) and the Y capacitor (72a)). In this example, the power source-side common mode choke coil (72b) includes three reactors that are respectively provided on the three power source lines and disposed between the power source (ES) and one ends of the three capacitors forming the Y capacitor (72a).

The load-side common mode choke coil (72c) is provided, on the power source line (700), between the one end of the Y capacitor (72a) (that is, the connection point between the power source line (700) and the Y capacitor (72a)) and the power converter (71). In this example, the load-side common mode choke coil (72c) includes three reactors that are respectively provided on the three power source lines and disposed between the power converter (71) and the one ends of the three capacitors forming the Y capacitor (72a).

Capacitor Formed in Compressor

In the heat exchange unit (10) of the present embodiment, a capacitor is formed in the compressor (30). The capacitor includes, for example, stray capacitance between the winding (not illustrated) of the motor (33) and the stator core (not illustrated) of the motor (33), stray capacitance between the motor (33) and the compressor casing (31), and stray capacitance between the compressor casing (31) and the structure (20).

Electrical Connection in Heat Exchange Unit

In the heat exchange unit (10) of the present embodiment, the compressor (30) is electrically connected to the heat exchanger (40) and the structure (20). In this example, the compressor (30) and the heat exchanger (40) are connected by the first refrigerant pipe (P1) as a first conductive path (E1). With such a configuration, the compressor (30) is electrically connected to the heat exchanger (40) through the first refrigerant pipe (P1). The compressor (30) and the gas shutoff valve (V1) are connected by the second refrigerant pipe (P2) as a second conductive path (E2), and the gas shutoff valve (V1) is fixed to the bottom plate (202) of the structure (20) by the shutoff valve support stand (25). With such a configuration, the compressor (30) is electrically connected to the structure (20) by the second refrigerant pipe (P2), the gas shutoff valve (V1), and the shutoff valve support stand (25).

The connection member (60) electrically connects the heat exchanger (40) and the structure (20). In this example, the connection member (60) is attached to the heat exchanger (40) and fixed to the support member (205) of the structure (20). With such a configuration, the heat exchanger (40) is electrically connected to the structure (20) by the connection member (60).

Equivalent Circuit Corresponding to Electrical Connection in Heat Exchange Unit

Figure 11:
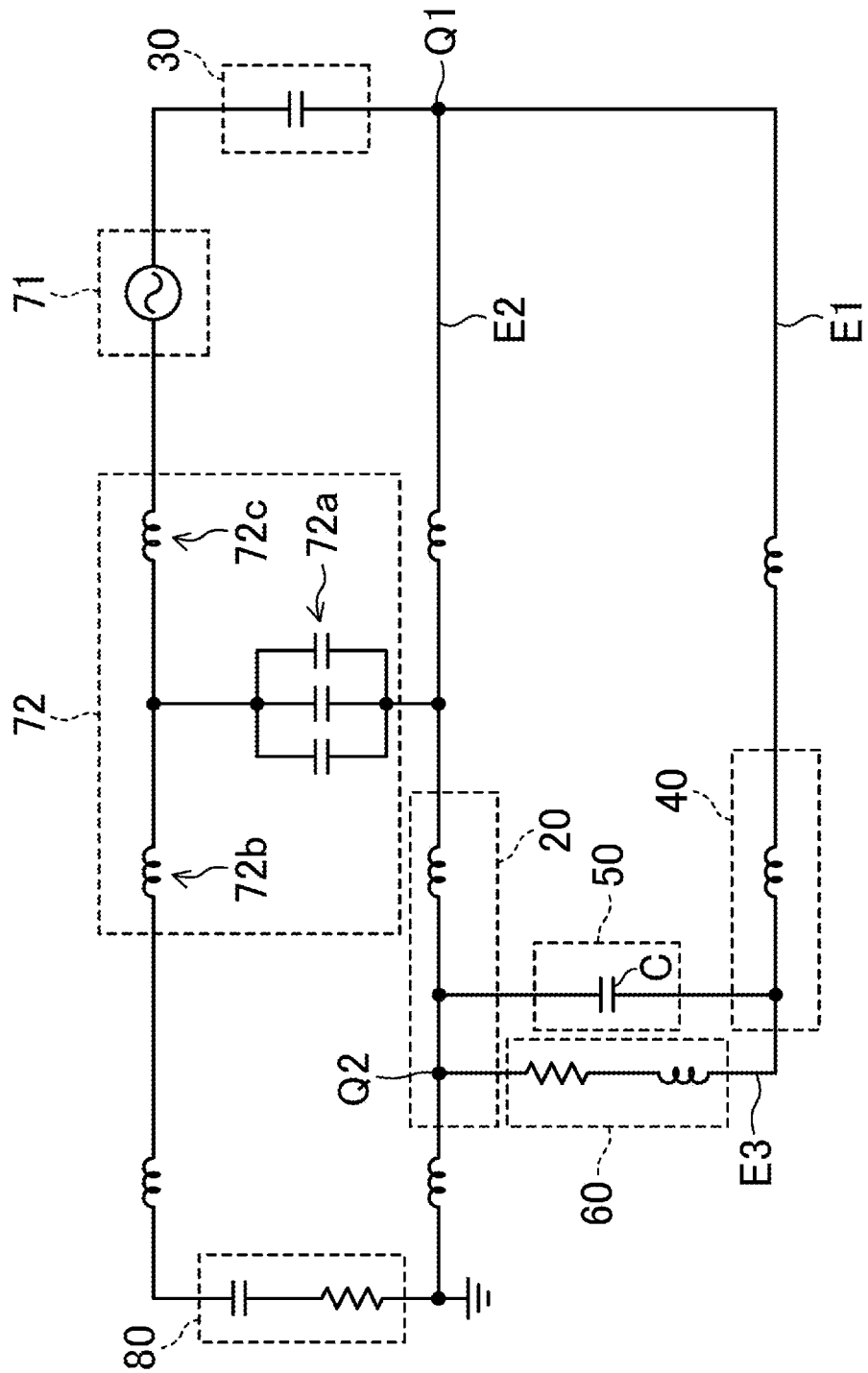
FIG. 11 is a circuit diagram illustrating an equivalent circuit corresponding to electrical connection in the heat exchange unit.

FIG. 11 illustrates an equivalent circuit corresponding to electrical connection in the heat exchange unit (10). In the example of FIG. 11, a measurement device (80) is connected in place of the power source (ES). The measurement device (80) is a line impedance stabilization network (LISN) for measuring a noise terminal voltage.

As illustrated in FIG. 11, the first conductive path (E1) is formed between the compressor (30) and the heat exchanger (40), and the second conductive path (E2) is formed between the compressor (30) and the structure (20). The heat exchanger (40) and the structure (20) are electrically insulated from each other by the insulating member (50), so that a capacitor (C) is provided between the heat exchanger (40) and the structure (20). With such electrical connection, a parallel resonance circuit including the capacitor (C) formed between the heat exchanger (40) and the structure (20) is formed on the conductive path among the compressor (30), the heat exchanger (40), and the structure (20) (conductive path between a first point Q1 and a second point Q2 in FIG. 11). When the parallel resonance circuit is configured in this manner on the conductive path among the compressor (30), the heat exchanger (40), and the structure (20), the impedance in the conductive path (impedance in a specific frequency band) rises. As a result, it becomes difficult for the current in a specific frequency band to flow into the noise filter (72). Therefore, in a case where the heat exchanger (40) and the structure (20) are not electrically connected by the connection member (60), it is difficult to reduce noise in a specific frequency band.

In the heat exchange unit (10) of the present embodiment, the heat exchanger (40) and the structure (20) are electrically connected by the connection member (60), and a third conductive path (E3) is formed between the heat exchanger (40) and the structure (20). This makes it possible to change the frequency characteristics of the parallel resonance circuit (parallel resonance circuit including the capacitor (C)) formed on the conductive path among the compressor (30), the heat exchanger (40), and the structure (20). Therefore, it is possible to reduce the impedance in the parallel resonance circuit (impedance in a specific frequency band). As a result, it is possible to reduce the impedance in the conductive path among the compressor (30), the heat exchanger (40), and the structure (20) (impedance in a specific frequency band). As a result, the current in the specific frequency band easily flows through the noise filter (72), making it possible to reduce the noise in the specific frequency band.

Frequency characteristics of heat exchange unit

Figure 12:
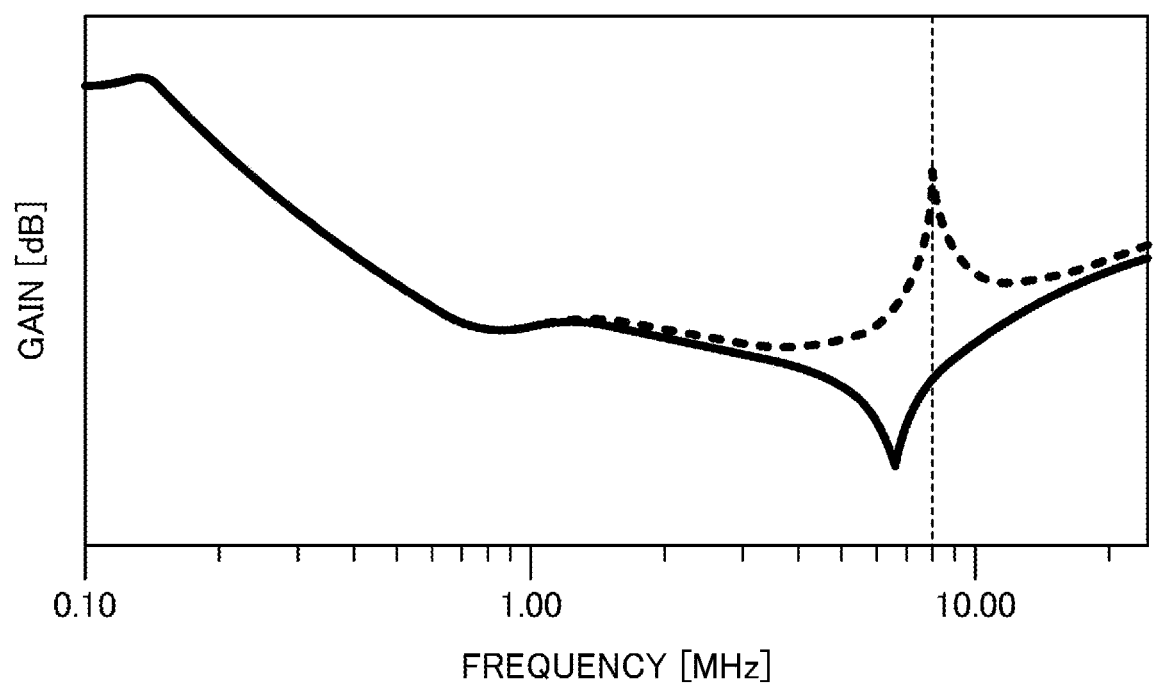
FIG. 12 is a graph illustrating frequency characteristics of the heat exchange unit.

FIG. 12 illustrates frequency characteristics of the heat exchange unit (10). In the example of FIG. 12, the broken line indicates the frequency characteristic of a heat exchange unit not provided with the connection member (60) (comparative example), while the solid line indicates the frequency characteristic of the heat exchange unit (10) of the present embodiment. The gain plotted on the vertical axis in FIG. 12 corresponds to a value obtained by dividing the voltage measured in the measurement device (80) by the voltage measured in the power converter (71).

As indicated by the broken line in FIG. 12, in the heat exchange unit not provided with the connection member (60) (comparative example), a peak due to resonance appears in a specific frequency band (frequency band centering around 8 MHz in the example of FIG. 12). This means that noise appears prominently in that specific frequency band.

As indicated by the solid line in FIG. 12, on the other hand, in the heat exchange unit (10) of the present embodiment provided with the connection member (60), a peak due to resonance does not appear in a specific frequency band (frequency band centering around 8 MHz in the example of FIG. 12). This means that noise is reduced in that specific frequency band.

Effects of Embodiment

As described above, the heat exchange unit (10) of the present embodiment includes: the heat exchanger (40); the structure (20) that supports the heat exchanger (40); the insulating member (50) that electrically insulates the heat exchanger (40) from the structure (20); the compressor (30) electrically connected to the heat exchanger (40) and the structure (20); and the connection member (60) that is attached to the heat exchanger (40) and electrically connects the heat exchanger (40) and the structure (20), the connection member (60) being provided separately from the first conductive path (E1) that electrically connects the compressor (30) and the heat exchanger (40) and the second conductive path (E2) that electrically connects the compressor (30) and the structure (20).

In the present embodiment, the heat exchanger (40) and the structure (20) are electrically connected by the connection member (60), whereby the third conductive path (E3) can be formed between the heat exchanger (40) and the structure (20). This makes it possible to change the frequency characteristics of the parallel resonance circuit (parallel resonance circuit including the capacitor (C)) formed on the conductive path among the compressor (30), the heat exchanger (40), and the structure (20). Therefore, it is possible to reduce the impedance in the parallel resonance circuit (impedance in a specific frequency band). As a result, it is possible to reduce the impedance in the conductive path among the compressor (30), the heat exchanger (40), and the structure (20) (impedance in a specific frequency band). As a result, the current in the specific frequency band easily flows through the noise filter (72), making it possible to reduce the noise in the specific frequency band.

The heat exchange unit (10) of the present embodiment includes the first refrigerant pipe (P1) connected to the compressor (30) and the heat exchanger (40). The heat exchanger (40) extends along the first direction. The first refrigerant pipe (P1) is connected to one end of the heat exchanger (40) in the first direction. In the heat exchanger (40), the connection member (60) is attached to a position closer to the other end of the heat exchanger (40) in the first direction than to the connecting portion between the heat exchanger (40) and the first refrigerant pipe (P1).

The present embodiment makes it possible to reduce the impedance (impedance in a specific frequency band) of the parallel resonance circuit formed on the conductive path among the compressor (30), the heat exchanger (40), and the structure (20), more than in a case where the connection member (60) is attached to one end of the heat exchanger (40) in the first direction (end on the side where the first refrigerant pipe (P1) is connected). As a result, the current in the specific frequency band easily flows through the noise filter (72), making it possible to further reduce the noise in the specific frequency band.

The heat exchange unit (10) of the present embodiment includes the first refrigerant pipe (P1) connected to the compressor (30) and the heat exchanger (40). The heat exchanger (40) includes the heat transfer tubes (41) extending horizontally, and is configured such that the first refrigerant pipe (P1) is connected to one end of the heat exchanger (40) in the extending direction of the heat transfer tubes (41), and the refrigerant flowing through the heat transfer tubes (41) turns back at the other end of the heat exchanger (40) in the extending direction of the heat transfer tubes (41). The connection member (60) is attached to a portion from the center (X) between the one end of the heat exchanger (40) and the other end of the heat exchanger (40) in the extending direction of the heat transfer tubes (41) to the other end of the heat exchanger (40).

The present embodiment makes it possible to reduce the impedance (impedance in a specific frequency band) of the parallel resonance circuit formed on the conductive path among the compressor (30), the heat exchanger (40), and the structure (20), more than in a case where the connection member (60) is attached to a portion from the one end of the heat exchanger (40) in the extending direction of the heat transfer tubes (41) to the center (X) between the one end of the heat exchanger (40) and the other end of the heat exchanger (40). As a result, the current in the specific frequency band easily flows through the noise filter (72), making it possible to further reduce the noise in the specific frequency band.

The heat exchange unit (10) of the present embodiment includes the first refrigerant pipe (P1) connected to the compressor (30) and the heat exchanger (40). The heat exchanger (40) includes the plurality of heat exchange sections (400) each formed in a plate shape. The first refrigerant pipe (P1) is connected to any one of the plurality of heat exchange sections (400). The connection member (60) is attached to, among the plurality of heat exchange sections (400), the heat exchange section (400) other than the heat exchange section (400) to which the first refrigerant pipe (P1) is connected.

The present embodiment makes it possible to reduce the impedance (impedance in a specific frequency band) of the parallel resonance circuit formed on the conductive path among the compressor (30), the heat exchanger (40), and the structure (20), more than in a case where the connection member (60) is attached to the heat exchange section (400) to which the first refrigerant pipe (P1) is connected. As a result, the current in the specific frequency band easily flows through the noise filter (72), making it possible to further reduce the noise in the specific frequency band.

In the present embodiment, the insulating member (50) is placed on the structure (20). The heat exchanger (40) is placed on the insulating member (50). The connection member (60) is attached to an upper part of the heat exchanger (40).

In the present embodiment, the connection member (60) can be attached to the heat exchanger (40) placed on the insulating member (50) more easily than in a case where the connection member (60) is attached to a lower part of the heat exchanger (40). It is therefore possible to assemble the heat exchange unit (10) easily.

The heat exchange unit (10) of the present embodiment also includes the fan (11). The structure (20) includes the first casing (21) that houses the compressor (30) and the heat exchanger (40), and the second casing (22) that is provided above the first casing (21) and houses the fan (11). The connection member (60) is disposed between the heat exchanger (40) and the second casing (22).

In the present embodiment, the connection member (60) is fixed to the structure (20).

In the present embodiment, the connection member (60) attached to the upper part of the heat exchanger (40) is fixed to the structure (20), making it possible to suppress the vibration of the heat exchanger (40). This can reduce the damage from the vibration of the heat exchanger (40).

In the present embodiment, the heat exchanger (40) includes a different kind of metal from the metal forming the structure (20). The connection member (60) includes: the first connection portion (61) that includes a same kind of metal as the metal forming the heat exchanger (40) and is in contact with the heat exchanger (40); the second connection portion (62) that includes a same kind of metal as the metal forming the structure (20) and is fixed to the structure (20); the insulating layer (63) that electrically insulates the first connection portion (61) from the second connection portion (62) and is provided with the gap portion (63a) that allows a part of the first connection portion (61) and a part of the second connection portion (62) to contact each other; and the covering member (64) that covers a contact portion between the first connection portion (61) and the second connection portion (62).

In the present embodiment, the contact portion between the first connection portion (61) and the second connection portion (62) is covered with the covering member (64), making it possible to prevent water from invading the contact portion between the first connection portion (61) and the second connection portion (62). This can prevent the occurrence of electrolytic corrosion.

In the present embodiment, the insulating member (50) has elasticity.

In the present embodiment, the heat exchanger (40) is placed on the elastic insulating member (50), making it possible to suppress the vibration of the heat exchanger (40). This can reduce the damage from the vibration of the heat exchanger (40).

Other Embodiments

In the above description, the compressor (30) is electrically connected to the structure (20) by the second refrigerant pipe (P2), the gas shutoff valve (V1), and the shutoff valve support stand (25) that constitute an example of the second conductive path (E2). For example, the compressor (30) may be electrically connected to the structure (20) by, as the second conductive path (E2), the first refrigerant pipe (P1), the four-way switching valve (13), the accumulator (14), and the oil separator (15). That is, the first refrigerant pipe (P1) connected to the compressor (30) and the heat exchanger (40) may be fixed to the structure (20), whereby the compressor (30) is electrically connected to the structure (20) through the first refrigerant pipe (P1). Alternatively, the accumulator (14) and the oil separator (15) may be electrically connected to the bottom plate (202) of the structure (20), whereby the compressor (30) is electrically connected to the structure (20) through the accumulator (14) and the oil separator (15).

The heat exchanger (40) having a U-shape in top view has been described above as an example of the heat exchanger (40), but the shape of the heat exchanger (40) is not limited to the U shape. For example, the shape of the heat exchanger (40) may be an L shape, a quadrangular shape, or a linear shape in top view. In the case of the heat exchanger (40) having an L shape in top view, for example, the first refrigerant pipe (P1) may be connected to one end of the L-shaped heat exchanger (40), and the connection member (60) may be attached to a position close to the other end of the L-shaped heat exchanger (40). Alternatively, the connection member (60) may be attached to the other end side with respect to the center (X) of the L-shaped heat exchanger (40) along the extending direction of the heat transfer tubes (41). Alternatively, the connection member (60) may be attached to the second heat exchange section on the other end side at which the heat transfer tubes (41) are folded back, not to the first heat exchange section on the one end side to which the first refrigerant pipe (P1) of the L-shaped heat exchanger (40) is connected. The connection member (60) is attached to a similar position regardless of whether the heat exchanger has an L shape, a quadrangular shape, or a linear shape in top view.

An example has been described above in which the heat exchange unit (10) is provided with the four-way switching valve (13), but the heat exchange unit (10) does not need to be provided with the four-way switching valve (13). In this case, the discharge port (or suction port) of the compressor (30) and the heat exchanger (40) are connected by the first refrigerant pipe (P1), and the suction port (or discharge port) of the compressor (30) and the gas shutoff valve (V1) are connected by the second refrigerant pipe (P2). That is, for example, the heat exchange unit (10) may constitute a cooling-only machine (or a heating-only machine).

An example has been described above in which the utilization-side heat exchanger (91) is provided in the utilization-side unit (90), but the utilization-side heat exchanger (91) may alternatively be provided in the heat exchange unit (10). In this case, the gas-side connection pipe (101), the liquid-side connection pipe (102), the gas shutoff valve (V1), and the liquid shutoff valve (V2) are omitted.

The foregoing description concerns the embodiment and modifications, and it will be understood that numerous variations of modes and details may be made without departing from the gist and scope of the appended claims. The foregoing embodiment and modifications may be combined with one another or features thereof may be replaced with one another, as long as it does not impair the features of the present disclosure.

As described above, the present disclosure is useful for a heat exchange unit.

The invention claimed is:

1. A heat exchange unit comprising:
   a heat exchanger;
   a structure supporting the heat exchanger;
   an insulating member electrically insulating the heat exchanger from the structure;
   a compressor electrically connected to the heat exchanger and the structure; and
   a connection member attached to the heat exchanger, the connection member electrically connecting the heat exchanger and the structure, the connection member being provided separately from
      a first conductive path that electrically connects the compressor and the heat exchanger, and
      a second conductive path that electrically connects the compressor and the structure.

2. The heat exchange unit according to claim 1, further comprising:
   a refrigerant pipe connected to the compressor and the heat exchanger,
   the heat exchanger extending along a first direction,
   the refrigerant pipe being connected to one end of the heat exchanger along the first direction, and
   the connection member being attached, in the heat exchanger, to a position closer to another end of the heat exchanger along the first direction than to a connecting portion between the heat exchanger and the refrigerant pipe.

3. The heat exchange unit according to claim 1, further comprising:
   a refrigerant pipe connected to the compressor and the heat exchanger,
   the heat exchanger including a heat transfer tube extending horizontally, and the heat exchanger being configured such that
      the refrigerant pipe is connected to one end of the heat exchanger along an extending direction of the heat transfer tube, and
      refrigerant flowing through the heat transfer tube turns back at another end of the heat exchanger along the extending direction, and
   the connection member being attached to a portion from a center of the heat exchanger to the other end along the extending direction, the center being between the one end and the other end of the heat exchanger.

4. The heat exchange unit according to claim 1, further comprising:
   a refrigerant pipe connected to the compressor and the heat exchanger,
   the heat exchanger including a plurality of heat exchange sections, with each heat exchange section formed in a plate shape,
   the refrigerant pipe being connected to any one of the heat exchange sections, and
   the connection member being attached to one of the heat exchange sections other than the heat exchange section to which the refrigerant pipe is connected.

5. The heat exchange unit according to claim 1, wherein
   the insulating member is disposed on the structure,
   the heat exchanger is disposed on the insulating member, and
   the connection member is attached to an upper part of the heat exchanger.

6. The heat exchange unit according to claim 5, further comprising:
a fan,
the structure including
a first casing that houses the compressor and the heat exchanger, and
a second casing that is disposed above the first casing and houses the fan, and
the connection member being disposed between the heat exchanger and the second casing.

7. The heat exchange unit according to claim 5, wherein the connection member is fixed to the structure.

8. The heat exchange unit according to claim 7, wherein the heat exchanger includes a different kind of metal from a metal forming the structure, and
the connection member includes
a first connection portion in contact with the heat exchanger, the first connection portion including a same kind of metal as the metal forming the heat exchanger,
a second connection portion fixed to the structure, the second connection portion including a same kind of metal as the metal forming the structure,
an insulating layer provided with a gap portion that allows a part of the first connection portion and a part of the second connection portion to contact each other, the insulating layer electrically insulating the first connection portion from the second connection portion, and
a covering member that covers a contact portion between the first connection portion and the second connection portion.

9. The heat exchange unit according to claim 5, wherein the insulating member has elasticity.

10. The heat exchange unit according to claim 1, wherein the heat exchanger includes aluminum, and
the structure includes iron.

* * * * *